US012626637B2

(12) United States Patent
    Hu

(10) Patent No.: US 12,626,637 B2
(45) Date of Patent: May 12, 2026

(54) PIXEL DRIVING CIRCUIT COMPRISING A VOLTAGE-DIVIDING TRANSISTOR AND MOBILE TERMINAL

(71) Applicant: TCL China Star Optoelectronics Technology Co., Ltd., Shenzhen (CN)

(72) Inventor: Daobing Hu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/602,790

(22) PCT Filed: Aug. 10, 2021

(86) PCT No.: PCT/CN2021/111781
    § 371 (c)(1),
    (2) Date: Oct. 11, 2021

(87) PCT Pub. No.: WO2023/010593
    PCT Pub. Date: Feb. 9, 2023

(65) Prior Publication Data
    US 2024/0169889 A1      May 23, 2024

(30) Foreign Application Priority Data

Aug. 2, 2021    (CN) .......................... 202110882071.9

(51) Int. Cl.
    *G09G 3/32*          (2016.01)
    *G09G 3/20*          (2006.01)
    (Continued)

(52) U.S. Cl.
    CPC ............. *G09G 3/32* (2013.01); *G09G 3/2007* (2013.01); *H01L 25/167* (2013.01);
    (Continued)

(58) Field of Classification Search
    CPC .................. G09G 3/32; G09G 3/2007; G09G 2300/0842; H01L 25/167; H01L 27/1222
    See application file for complete search history.

(56) References Cited

U.S. PATENT DOCUMENTS 5,287,011 A  * 2/1994 Koshikawa .......... H03K 17/145
                                                327/143
6,242,870 B1   6/2001 Koyanagi et al.
             (Continued)

FOREIGN PATENT DOCUMENTS

CN          1532789 A  * 9/2004
CN          1319039 C    5/2007
             (Continued)

OTHER PUBLICATIONS

Keim, Robert, "MOSFET Channel-Length Modulation," Jul. 25, 2016, https://www.allaboutcircuits.com/technical-articles/mosfet-channel-length-modulation/ (Year: 2016).*
             (Continued)

*Primary Examiner* — Nathan P Brittingham
(74) *Attorney, Agent, or Firm* — Nathan & Associates Patent Agents Ltd.; Menachem Nathan

(57)              ABSTRACT

A pixel driving circuit and a mobile terminal are provided. The pixel driving circuit includes a switch thin film transistor, a storage circuit, and a light driving circuit. The switch thin film transistor receives data signal applied on the data line in response to scan signal applied on the scan line. The storage circuit is charged by the data signal. The light driving circuit emits light in response to the data signal. The
                 (Continued)

light driving circuit includes a driving unit, light-emitting unit, a supply voltage end, a ground end, and a voltage-dividing transistor that is coupled between the driving unit and the ground end.

16 Claims, 4 Drawing Sheets

(51) Int. Cl.
$$\begin{array}{lll} H01L\ 25/16 & (2023.01) \\ H10D\ 86/40 & (2025.01) \\ H10D\ 86/60 & (2025.01) \end{array}$$
(52) U.S. Cl.
CPC ........... *H10D 86/421* (2025.01); *H10D 86/60* (2025.01); *G09G 2300/0842* (2013.01)

(56) References Cited

U.S. PATENT DOCUMENTS

| | | | | |
|---|---|---|---|---|
| 2002/0008684 | A1* | 1/2002 | Udo | G09G 3/2011 |
| | | | | 345/92 |
| 2002/0195968 | A1* | 12/2002 | Sanford | G09G 3/325 |
| | | | | 315/169.3 |
| 2003/0098829 | A1 | 5/2003 | Chen et al. | |
| 2011/0134157 | A1* | 6/2011 | Chaji | G09G 3/3233 |
| | | | | 345/212 |
| 2021/0335219 | A1* | 10/2021 | Halbritter | G09G 3/2014 |
| 2022/0344480 | A1* | 10/2022 | Wang | H01L 27/1222 |

FOREIGN PATENT DOCUMENTS

| | | | |
|---|---|---|---|
| CN | 101828213 A | | 9/2010 |
| CN | 101996580 A | | 3/2011 |
| CN | 102568373 A | | 7/2012 |
| CN | 104183211 A | * | 12/2014 |
| CN | 110473496 A | | 11/2019 |
| CN | 113421499 A | | 9/2021 |
| JP | 2004271646 A | | 9/2004 |

OTHER PUBLICATIONS

Simicic et al., Electrostatic discharge robustness of amorphous indium-gallium-zinc-oxide thin-film transistors, Microelectronics Reliability, 108, p. 1-7 (Year: 2020).*

* cited by examiner

10

PIXEL DRIVING CIRCUIT COMPRISING A VOLTAGE-DIVIDING TRANSISTOR AND MOBILE TERMINAL

CROSS REFERENCE

This application is a US national phase application based upon an International Application No. PCT/CN2021/111781, filed on Aug. 10, 2021, which claims the priority of Chinese Patent Application No. 202110882071.9, entitled "Pixel Driving Circuit and Mobile Terminal", filed on Aug. 2, 2021, the disclosure of which is incorporated herein by reference in its entirety.

FIELD OF THE INVENTION

The present disclosure relates to a field of a display panel, more particularly, to a pixel driving circuit and a mobile terminal.

BACKGROUND

In contrast to conventional backlight, using Mini-LEDs as backlight sources shows better contrast. Currently, two transistors and one capacitor (2T1C) drive architecture is mostly used in the current Mini-LED display panel, and a light-emitting diode (LED) is a current drive device. Under this technology, the stability requirements of thin film transistor (TFT) devices are very high, especially the stability and uniformity of driving thin film transistors used to drive light emitting diodes will directly affect the brightness of light emitting diodes.

Conventionally, a Metal-Oxide-Semiconductor Field-Effect Transistor (MOSFET), hereinafter referred to as a MOS transistor, is used as a driving transistor of a pixel driving circuit. However, since MOSFET is mainly operated in a saturation region, a few change in data voltage applied on a gate of the MOSFET induces a great change in current flowing through a drain of the MOSFET. Therefore, a pixel driving circuit using the MOSFETs may not output exact current corresponding to high grey scales.

SUMMARY

Technical Problem

The present disclosure proposes a pixel driving circuit and a mobile terminal, effectively solving the problem that the pixel driving circuit using the MOSFETs may not output exact current corresponding to high grey scales.

Technical Solution

According to a first aspect of the present disclosure, a pixel driving circuit used in a display panel having a scan line and a data line is provided. The pixel driving circuit includes a switch thin film transistor, a storage circuit, and a light driving circuit. The switch thin film transistor is configured to receive data signal applied on the data line in response to scan signal applied on the scan line. The storage circuit, electrically connected to the switch transistor, is configured to be charged by the data signal. The light driving circuit is configured to emit light in response to the data signal. The light driving circuit has a driving unit, light-emitting unit, a supply voltage end, a ground end, and a voltage-dividing transistor that is coupled between the driving unit and the ground end.

Preferably, a resistance of the voltage-dividing transistor is proportional to levels of grayscales of the display panel.

Preferably, the voltage-dividing transistor is a voltage-dividing thin film transistor having a gate and a drain coupled thereto, and a ratio of a channel and a channel length is proportional to levels of grayscales of the display panel.

Preferably, the pixel driving circuit further comprises a control module, configured to adjust supply voltage fed into the pixel driving circuit to make the voltage-dividing thin film transistor operate in a linear region or a saturation region.

Preferably, the switch thin film transistor and the voltage-dividing thin film transistor are Amorphous silicon thin film transistors or indium gallium zinc oxide thin film transistors.

Preferably, the voltage-dividing transistor is realized by transistors connected in series or in parallel.

Preferably, the storage circuit comprises a capacitor connected between the light driving circuit and the ground end.

Preferably, the driving unit is a Metal Oxide Semiconductor Field Effect Transistor (MOSFET) that comprises a gate coupled to the switch thin film transistor, a drain coupled to the supply voltage end, and a source coupled to the ground end.

Preferably, the light-emitting unit is coupled between the supply voltage end and the driving unit or between the driving unit and the ground end.

Preferably, a ratio of a supply voltage fed to the pixel driving circuit and a sum of a first resistance of the voltage-dividing transistor and a second resistance of the light-emitting unit is between values of a minimum driving current and a maximum driving current of the light-emitting unit.

Preferably, the voltage-dividing transistor is a light emitting diode.

According to a second aspect of the present disclosure, a mobile terminal includes a pixel driving circuit, a gate driver, and a source driver. The pixel driving circuit includes a switch thin film transistor, a storage circuit, and a light driving circuit. The switch thin film transistor is configured to receive data signal applied on the data line in response to scan signal applied on the scan line. The storage circuit, electrically connected to the switch transistor, is configured to be charged by the data signal. The light driving circuit is configured to emit light in response to the data signal. The light driving circuit has a driving unit, light-emitting unit, a supply voltage end, a ground end, and a voltage-dividing transistor that is coupled between the driving unit and the ground end.

Preferably, a resistance of the voltage-dividing transistor is proportional to levels of grayscales of the display panel.

Preferably, the voltage-dividing transistor is a voltage-dividing thin film transistor having a gate and a drain coupled thereto, and a ratio of a channel and a channel length is proportional to levels of grayscales of the display panel.

Preferably, the pixel driving circuit further comprises a control module, configured to adjust supply voltage fed into the pixel driving circuit to make the voltage-dividing thin film transistor operate in a linear region or a saturation region.

Preferably, the switch thin film transistor and the voltage-dividing thin film transistor are Amorphous silicon thin film transistors or indium gallium zinc oxide thin film transistors.

Preferably, the storage circuit comprises a capacitor connected between the light driving circuit and the ground end.

Preferably, the driving unit is a Metal Oxide Semiconductor Field Effect Transistor (MOSFET) that comprises a gate coupled to the switch thin film transistor, a drain coupled to the supply voltage end, and a source coupled to the ground end.

Preferably, the light-emitting unit is coupled between the supply voltage end and the driving unit or between the driving unit and the ground end.

Preferably, a ratio of a supply voltage fed to the pixel driving circuit and a sum of a first resistance of the voltage-dividing transistor and a second resistance of the light-emitting unit is between values of a minimum driving current and a maximum driving current of the light-emitting unit.

Advantageous Effect

The present disclosure proposes a pixel driving circuit and a mobile terminal. The pixel driving circuit used in a display panel having a scan line and a data line is provided. The pixel driving circuit includes a switch transistor, a storage circuit, and a light driving circuit. The switch transistor is configured to receive data signal applied on the data line in response to scan signal applied on the scan line. The storage circuit, electrically connected to the switch transistor, is configured to be charged by the data signal. The light driving circuit is configured to emit light in response to the data signal. The light driving circuit has a driving unit, light-emitting unit, a supply voltage end, a ground end, and a voltage-dividing transistor that is coupled between the driving unit and the ground end. According to the present disclosure, the driving unit drives the light-emitting unit to emit light in response to the data signal DATA when the voltage is divided by the voltage-dividing transistor, so that the change in current of the light-emitting unit caused by the change of the data signal DATA received by the driving unit 13 can be reduced. The current change of the pixel driving circuit can realize the display control under high gray scales.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF THE EMBODIMENTS

Figure 1:
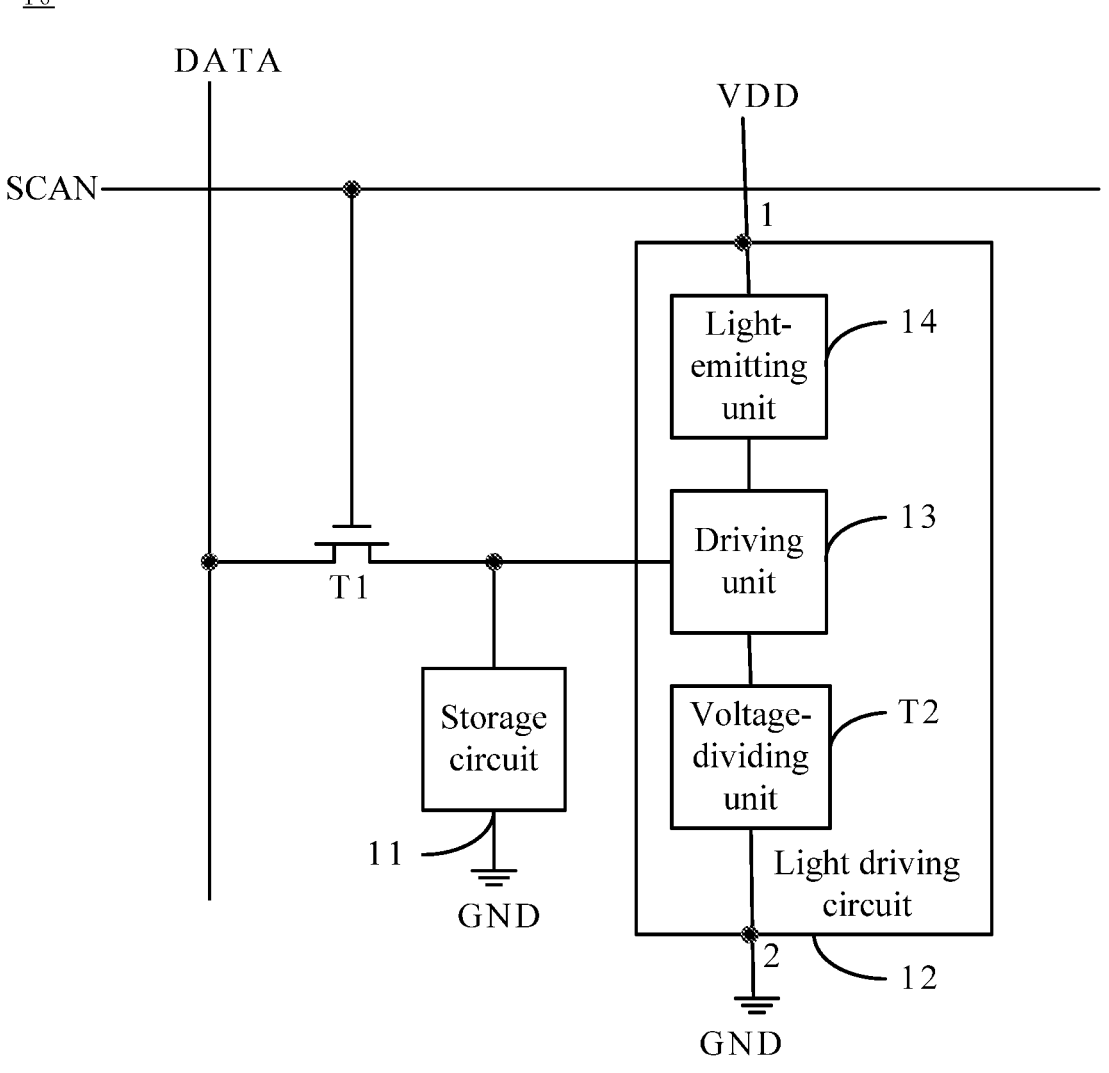
FIG. 1 illustrates a block diagram of a pixel driving circuit according to a preferred embodiment of the present disclosure.

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. Besides, the first characteristic arranged on/above/over the second characteristic implies that the first characteristic arranged right above/obliquely above or merely means that the level of the first characteristic is higher than the level of the second characteristic. The first characteristic arranged under/below/beneath the second characteristic implies that the first characteristic arranged right under/obliquely under or merely means that the level of the first characteristic is lower than the level of the second characteristic.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement. The methods proposed by the present disclosure provide a variety of examples with a variety of processes and materials. However, persons skilled in the art understand ordinarily that the application of other processes and/or the use of other kinds of materials are possible.

The present disclosure proposes a pixel driving circuit to solve the problem that the conventional driving circuit using the MOS transistor as a driving transistor may not output exact current corresponding to high grey scales.

Please refer to FIG. 1 illustrating a block diagram of a pixel driving circuit 10 according to a preferred embodiment of the present disclosure.

The pixel driving circuit 10 is used in a display panel which includes scan lines and data lines. The pixel driving circuit 10 includes a switch thin film transistor T1, a storage circuit 11 coupled to the switch transistor, and a light driving circuit 12. The switch thin film transistor T1 conducts data signal DATA applied on the data line in response to scan signal SCAN applied on the scan line. The storage circuit 11 is charged by the data signal DATA and the light driving circuit 12 is driven by the data signal DATA to emit light.

The light driving circuit 12 includes a driving unit 13, light-emitting unit 14, a supply voltage end 1, a ground end 2, and a voltage-dividing transistor T2 that is coupled between the driving unit 13 and the ground end 2.

In this embodiment, the voltage-dividing transistor T2 is connected in series between the driving unit 13 and the ground end 2. The driving unit 13 drives the light-emitting unit 14 to emit light according to the data signal DATA when the voltage is divided by the voltage-dividing transistor T2, so that the change in current of the light-emitting unit 14 caused by the change of the data signal DATA received by the driving unit 13 can be reduced. The current change of the pixel driving circuit 10 can realize the display control under high gray scales. In addition, the resistance of the voltage-dividing transistor T2 is changed depending on the supply voltage VDD, so that the pixel driving circuit 10 has high real-time controllability.

Figure 2:
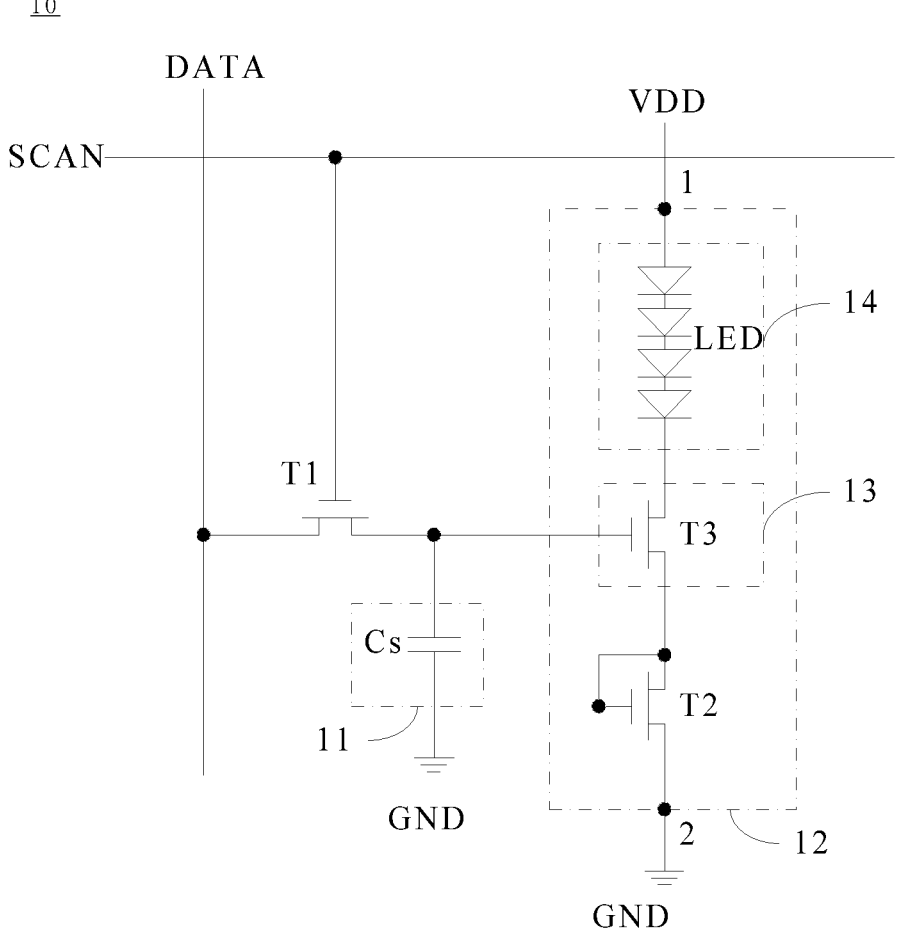
FIG. 2 illustrates a circuit diagram of the pixel driving circuit according to a preferred embodiment of the present disclosure.

Please refer to FIG. 2 illustrating a circuit diagram of the pixel driving circuit 10 according to a preferred embodiment of the present disclosure.

The storage circuit 11 is a capacitor Cs. The driving circuit 10 is a Metal Oxide Semiconductor Field Effect Transistor (MOSFET) T3. The light-emitting unit 14 includes four light emitting diodes (LEDs).

The gate of the switch thin film transistor T1 is electrically connected to the scan line, the drain of the switch thin film transistor T1 is electrically connected to the data line, the source of the switch thin film transistor T1 is electrically connected to one end of the capacitor Cs and the gate of the MOS transistor T3. The switch thin film transistor T1 can be an amorphous silicon thin film transistor (a-Si TET) or an indium gallium zinc oxide thin film transistor (IGZO TFT). It should be noted that in this embodiment, the pixel driving circuit 10 only includes one switch thin film transistor T1.

However, in another embodiments, the pixel driving circuit 10 may also include multiple switch thin film transistors connected in series or in parallel. The gate of each switch thin film transistor is connected to the scan line. In the embodiment where multiple switch thin film transistors are connected in parallel, le drain of each switch thin film transistor is used to access the data signal DATA. In the embodiment where multiple switch thin film transistors are connected in series, a drain of one of switch thin film transistors is connected to the data signal DATA.

One end of the capacitor Cs is electrically connected to the gate of the MOS transistor T3 and the source of the switch thin film transistor T1, and the other end of the capacitor Cs is electrically connected to the around end 2. In this embodiment, the storage circuit 11 includes only one capacitor. In other embodiments of the present disclosure, the storage circuit 11 may include multiple capacitors connected in series or in parallel. In the embodiment where multiple capacitors are connected in parallel, one end of each capacitor is electrically connected to the gate of the MOS transistor T3 and the source of the switch thin film transistor T1, and the other end is electrically connected to the ground end 2. In the embodiment, one end of one of the plurality of capacitors is electrically connected to the gate of the MOS transistor T3 and the source of the switch thin film transistor T1, and one end of the other of the plurality of capacitors is electrically connected to the ground end 2.

The gate of the MOS transistor T3 is electrically connected to the source of the switch thin fil, transistor T1 and the capacitor Cs, the drain of the MOS transistor T3 is electrically connected to the cathode of the light emitting diode LED, the source of the MOS transistor T3 is electrically connected to the voltage-dividing transistor T2. The MOS transistor T3 is used as a driving transistor in the pixel driving circuit 10.

The anode of the light emitting diode LED is electrically connected to the supply voltage end 1, and the cathode of the light emitting diode LED is electrically connected to the drain of the MOS transistor T3. In this embodiment, the light-emitting unit 14 includes four LEDs connected in series. In this embodiment, the light-emitting unit 14 is connected between the supply voltage end 1 and the driving unit 13. In another embodiment, the light-emitting unit 14 may be connected between the driving unit 13 and the ground end 2.

Figure 3A:
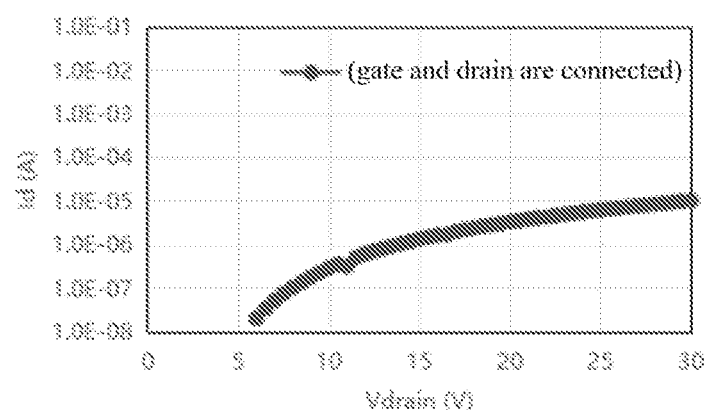
FIG. 3*a* depicts a characteristic curve of the drain current and source-drain voltage the voltage dividing transistor of which a gate and a drain are connected.
Figure 3B:
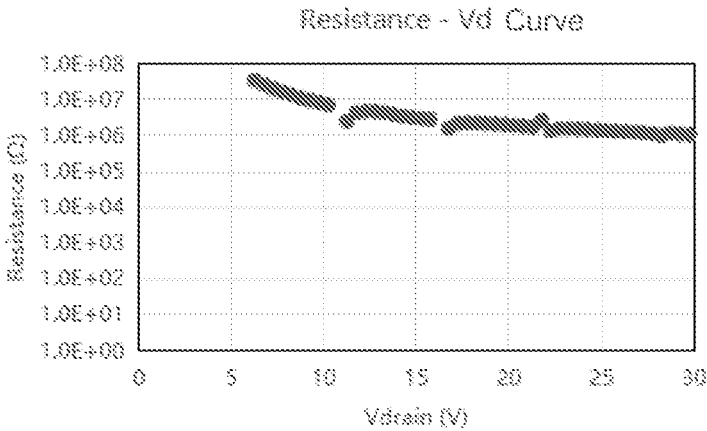
FIG. 3*b* depicts resistance versus source-drain voltage of the voltage dividing transistor of which a gate and a drain are connected.

The voltage-dividing transistor T2 is connected in series between the source of the MOS transistor T3 and the ground end 2. The voltage-dividing transistor T2 is a voltage-dividing thin film transistor T of which a gate and a drain are connected with source of the MOS transistor T3. Please refer to FIGS. 3a and 3b. FIG. 3a depicts a characteristic curve of the drain current (Id) and source-drain voltage (Vdrain) the voltage dividing transistor T2 of which a gate and a drain are connected. When the source-drain voltage (Vdrain) of the voltage divider transistor T2 increases from zero, the voltage-dividing transistor T2 works in the linear region, and its drain current (Id) increases with the increase of the source-drain voltage (Vdrain). When the source-drain voltage (Vdrain) further increases to a certain value, the voltage-dividing transistor T2 works in the saturation region, and its drain current (Id) no longer increases with the increase of the source-drain voltage (Vdrain), but tends to a certain value. FIG. 3b depicts resistance versus source-drain voltage (Vdrain) of the voltage dividing transistor T2 of which a gate and a drain are connected.

The voltage-dividing transistor T2 can be an amorphous silicon thin film transistor (a-Si TFT) or an indium gallium zinc oxide thin film transistor (IGZO TFT). In this embodiment, the pixel driving circuit 10 includes only one voltage-dividing transistor T2. In other embodiments of the present disclosure, the pixel driving circuit 10 may include multiple voltage-dividing transistors connected in series or in parallel. In other embodiment, the voltage-dividing transistor T2 can be a diode.

During the operation of the pixel driving circuit 10, when the scan signal SCAN is a high-level signal, the switch thin film transistor T1 is turned on, and the data signal DATA is fed into the gate of the MOS transistor T3 and the capacitor Cs through the drain of the switch thin film transistor T1. After that, the switch thin film transistor T1 is turned off. Due to the storage effect of the capacitor Cs, the gate voltage of the MOS transistor T3 can still maintain the potential of the data signal DATA, so that the MOS transistor T3 is still turned on to induce driving current flowing through the MOS transistor T3 to drive the light-emitting diode LED to emit light.

Figure 4A:
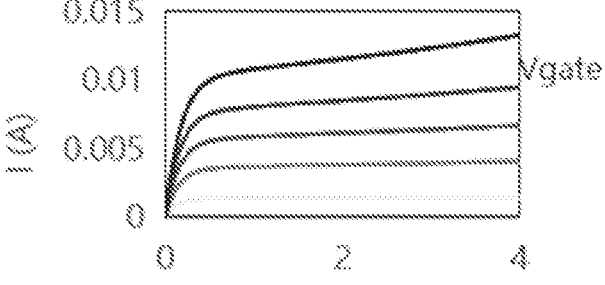
FIG. 4*a* is a characteristic curve diagram of the MOS transistor of the pixel driving circuit without the voltage-dividing transistor.
Figure 4B:
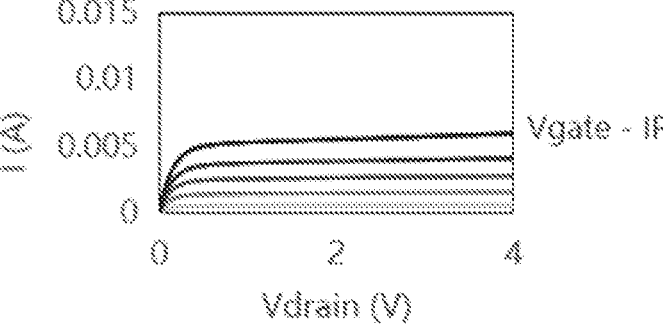
FIG. 4*b* is a characteristic curve diagram of the MOS transistor of the pixel driving circuit with the voltage-dividing transistor.

Please refer to FIG. 4a and FIG. 4b. FIG. 4a is a characteristic curve diagram of the MOS transistor T3 of the pixel driving circuit 10 without the voltage-dividing transistor T2. FIG. 4b is a characteristic curve diagram of the MOS transistor T3 connected in series with the voltage-dividing transistor T2. In FIGS. 4a and 4b, x-axis represents source-drain voltage (lids) of the MOS transistor T3, and y-axis represents source-drain current (Ids) of the MOS transistor T3. Each curve indicates: when the gate-source voltage (Vgate) of the MOS transistor T3 remains unchanged, the source-drain current (his) changes with the source-drain voltage (Uds). Further, given that the gate-source voltage (Vgate) of the MOS transistor T3 maintains a constant value, the MOS transistor T3 works in the constant current region (i.e., the saturation region) when the source-drain voltage (Uds) increases to a certain value. The source-drain current (Ids) no longer increases with the increase of the source-drain voltage (Uds), but tends to a certain value. Further, the greater the gate-source voltage (Vgate) of the MOS transistor T3 is, the greater the source-drain current (Ids) when it works in the constant current region is.

When the pixel driving circuit 10 is operating, the MOS transistor T3 works in the constant current region. At this time, in the case that there is no voltage-dividing transistor T2 between the source of the MOS transistor T3 and the ground end GND, voltage (Vgate) across the gate and source of the MOS transistor T3 is "DATA-GND". High gray-scale voltage (that is, high DATA voltage) received by the pixel driving circuit 10 induces large source-drain current (Ids) which is easily exceed the maximum current allowed by the light-emitting diode LED. In addition, a small change in the voltage (Vgate) across the gate and source of the MOS transistor T3 at a larger value will induce a large change in the source-drain current (Ids). The change of the current (Ids) is not conducive to enabling the pixel driving circuit 10 to perform display control under high gray scale. In this embodiment, because the voltage-dividing transistor T2 is connected in series between the source of the MOS transistor T3 and the ground end GND, when the MOS transistor T3 receives the same gray-scale voltage DATA, voltage (Vgate) across the gate and source of the MOS transistor T3 is divided and reduced to "DATA-GND-I*R", effectively reducing source-drain current (Ids). When the magnitude of the data signal DATA changes, the source-drain current (Ids) of the MOS transistor T3 is also correspondingly smaller, so that the pixel driving circuit 10 can be implemented display control in high grayscale.

The pixel driving circuit 10 further includes a control module (not shown in the figure), which is used to adjust the supply voltage VDD fed into the pixel driving circuit 10 to make the voltage divider transistor T2 work in the linear region or the saturated region. Specifically, when voltage applied to the MOS transistor T3 needs to be divided by the voltage-dividing transistor T2 with a larger resistance value, the voltage divider transistor T2 can be operated in the linear region by lowering the VDD voltage. When the voltage applied to the MOS transistor T3 needs to be divided by the voltage-dividing transistor T2 with a smaller resistance value, the voltage dividing transistor T2 can be operated in the saturation region by raising the VDD voltage.

Specifically, the number of gray levels of the display panel is proportional to the resistance of the voltage-dividing transistor T2. The higher the number of levels of gray scales of the display panel is, the greater the resistance of the voltage-dividing transistor T2 is. The lower the number of levels of gray scales of the display panel is, the smaller the resistance of voltage-dividing transistor T2 is. 11 this embodiment, since the voltage dividing transistor T2 is a voltage dividing thin film transistor, a ratio of channel width and channel length of the voltage dividing transistor T2 is proportional to the resistance of the voltage dividing thin film transistor. Therefore, the ratio of the channel width and the channel width of the voltage dividing thin film transistor is proportional to the number of gray levels of the display panel.

Further, the voltage-dividing transistor T2 has a first resistance R, the light emitting diode LED has a second resistance $R_{LED}$. A ratio of the supply voltage VDD fed to the pixel driving circuit 10 and a sum of the first resistance R of the voltage-dividing transistor T2 and the second resistance $R_{LED}$ of the light emitting diode LED is between values of a minimum driving current $I_{min}$ and a maximum driving current $I_{max}$ of the light emitting diode LED, i.e. $I_{min} < VDD/(R+R_{LED}) < I_{max}$.

In contrast to prior art, the present disclosure proposes the pixel driving circuit 10 used in a display panel having a scan line and a data line. The pixel driving circuit 10 includes a switch thin film transistor T1, a storage circuit 11, and a light driving circuit 12. The switch thin film transistor T1 is configured to receive data signal DATA applied on the data line in response to scan signal SCAN applied on the scan line. The storage circuit 11, electrically connected to the switch thin film transistor T1, is configured to be charged by the data signal DATA. The light driving circuit 12 is configured to emit light in response to the data signal DATA. The light driving circuit 12 has a driving unit 13, a light-emitting unit 14, a supply voltage end 1, a ground end 2, and a voltage-dividing transistor T2 that is coupled between the driving unit 13 and the ground end 2. According to the present disclosure, the driving unit 13 drives the light-emitting unit 14 to emit light in response to the data signal DATA when the voltage is divided by the voltage-dividing transistor T2, so that the change in current of the light-emitting unit 14 caused by the change of the data signal DATA received by the driving unit 13 can be reduced. The current change of the pixel driving circuit 10 can realize the display control under high gray scales.

Figure 5:
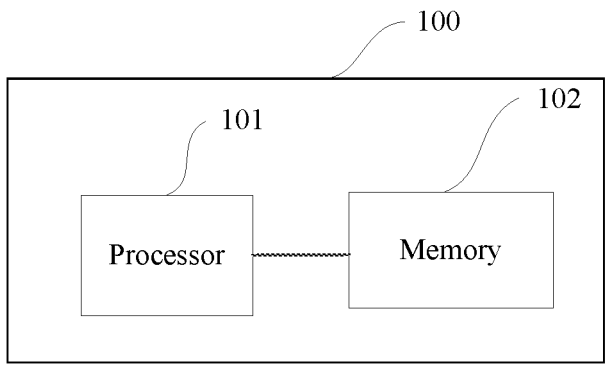
FIG. 5 illustrates a schematic diagram of a mobile terminal according to another embodiment of the present disclosure.

Please refer to FIG. 5 illustrating a schematic diagram of a mobile terminal according to another embodiment of the present disclosure. The pixel driving circuit 10 is used in the mobile terminal which can be a smart phone or a tablet computer.

The mobile terminal 100 comprises a processor 101 and a memory 102 coupled to the processor 102.

The processor 180 is a control center of the mobile terminal 100, and connects various parts of the terminal by using various interfaces and lines. By running or executing the software program and/or module stored in the memory 102, and invoking data stored in the memory 102, the processor 101 performs various functions and data processing of the mobile terminal 100, thereby performing overall monitoring on the mobile phone.

Figure 6:
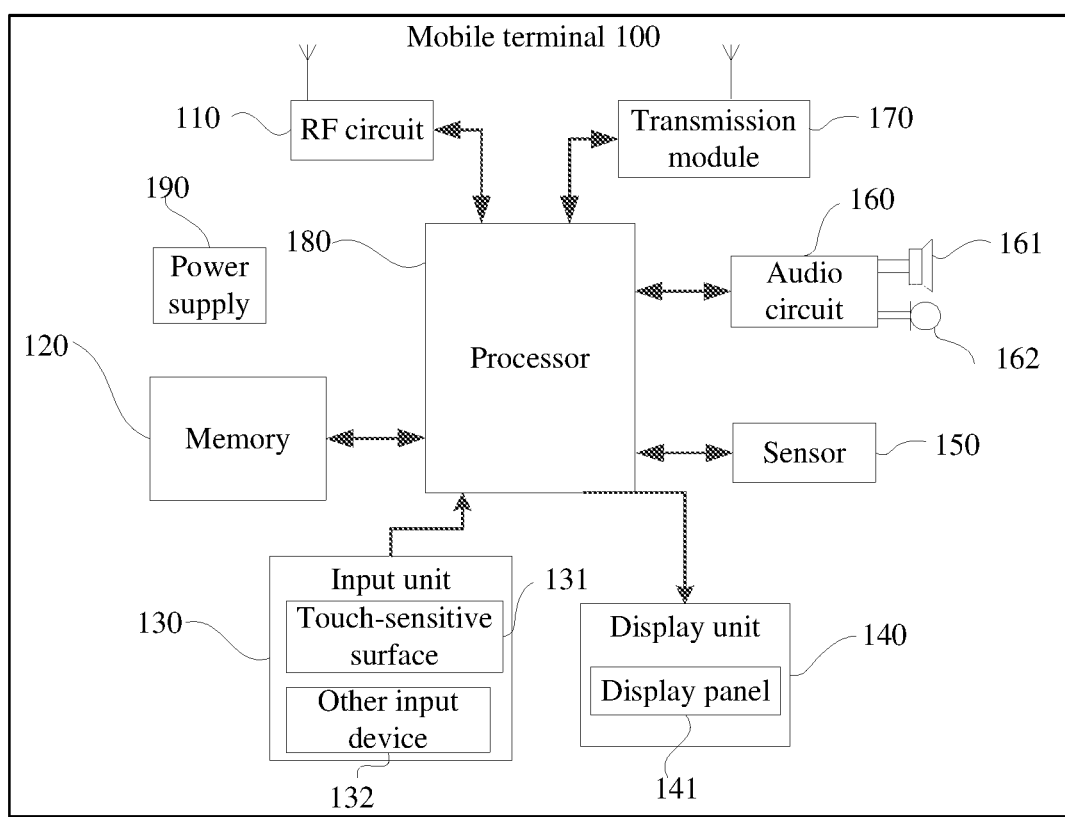
FIG. 6 is a block diagram of a mobile terminal according to one embodiment of the present disclosure.

FIG. 6 is a block diagram of a mobile terminal 100 according to one embodiment of the present disclosure. The mobile terminal 100 may be a smart phone or a tablet computer.

As shown in FIG. 6, the mobile terminal 100 may comprise components, such as a radio frequency (RF) circuit 110, a memory 120, an input unit 130, a display unit 140, a sensor 150, an audio circuit 160, a transmission module 170, a processor 180 including one or more (only one is shown in the figure) processing cores, and a power supply 190, etc. Those skilled in the art would understand that the mobile terminal 100 is not limited to the structure of the mobile terminal 100 shown in FIG. 6. The mobile terminal 100 may comprise more or less components than those illustrated in the figure, or some components may be combined, or may have different components arrangements.

The RF circuit 110 may be configured to receive and send a signal during an information receiving and sending process or a conversation process. Specifically, after receiving downlink information from a base station, the RF circuit 110 delivers the downlink information to one or more processors 180 for processing, and sends related uplink data to the base station. Generally, the RF circuit 110 includes, but is not limited to, an antenna, at least one amplifier, a tuner, one or more oscillators, a subscriber identity module (SIM) card, a transceiver, a coupler, a low noise amplifier (LNA), and a duplexer. In addition, the RF circuit 110 may also communicate with a network and another device by wireless communication. The wireless communication may use any communications standard or protocol, which includes, but is not limited to, a Global System for Mobile communications (GSM), an Enhanced Data GSM Environment (EDGE), a Wideband Code Division Multiple Access (WCDMA), a Code Division Access (CDMA), a Time Division Multiple Access (TDMA), a Wireless Fidelity (Wi-Fi) such as IEEE 802.11a, IEEE 802.11b, IEEE802.11g and IEEE 802.11n, a Voice over Internet Protocol (VoIP), a Worldwide Interoperability for Microwave Access (Wi-Max), any other protocols for e-mail, instant communication and short message, and the like.

The memory 120 may be configured to store a software program and module. The processor 180 runs the software program and module stored in the memory 120, to implement various functional applications and data processing. The memory 120 may mainly include a program storage area and a data storage area. The program storage area may store an operating system, an application program required by at least one function (such as a sound playback function and an image display function), and the like. The data storage area may store data (such as audio data and an address book) created according to use of the mobile terminal 100, and the like. In addition, the memory 120 may include a high speed random access memory, and may also include a non-volatile memory, such as at least one magnetic disk storage device, a flash memory device, or another volatile solid-state storage device. Correspondingly, the memory 120 may further include a memory controller, so that the processor 180 and the input unit 130 access the memory 120.

The input unit 130 may be configured to receive input digit or character information, and generate keyboard, mouse, joystick, optical, or track ball signal input related to the user setting and function control. Specifically, the input unit 130 may include a touch-sensitive surface 131 and other input device 132. The touch-sensitive surface 131 may also be referred to as a touch screen or a touch panel, and may collect a touch operation of a user on or near the touch-sensitive surface (such as an operation of a user on or near the touch-sensitive surface 131 by using any suitable object or attachment, such as a finger or a stylus), and drive a corresponding connection apparatus according to a preset program. Optionally, the touch-sensitive surface 131 may include two parts: a touch detection apparatus and a touch controller. The touch detection apparatus detects a touch position of the user, detects a signal generated by the touch operation, and transfers the signal to the touch controller. The touch controller receives the touch information from the touch detection apparatus, converts the touch information into touch point coordinates, and sends the touch point coordinates to the processor 180. Moreover, the touch controller can receive and execute a command sent from the processor 180. In addition, the touch-sensitive surface 131 may be implemented by using various types, such as a resistive type, a capacitance type, an infrared type, and a surface sound wave type. In addition to the touch-sensitive surface 131, the input unit 130 may further include the another input device 132. Specifically, the another input device 132 may include, but is not limited to, one or more of a physical keyboard, a functional key (such as a volume control key or a switch key), a track ball, a mouse, and a joystick.

The display unit 140 may be configured to display information input by the user or information provided for the user, and various graphical user ports of the mobile terminal 100. The graphical user ports may be formed by a graph, a text, an icon, a video, and any combination thereof. The display unit 140 may include a display panel 141. Optionally, the display panel 141 may be configured by using a liquid crystal display (LCD), an organic light-emitting diode (OLED), or the like. Further, the touch-sensitive surface 131 may cover the display panel 141. After detecting a touch operation on or near the touch-sensitive surface 131, the touch-sensitive surface 131 transfers the touch operation to the processor 180, so as to determine a type of a touch event. Then, the processor 180 provides corresponding visual output on the display panel 141 according to the type of the touch event. Although, in FIG. 5, the touch-sensitive surface 131 and the display panel 141 are used as two separate parts to implement input and output functions, in some embodiments, the touch-sensitive surface 131 and the display panel 141 may be integrated to implement the input and output functions.

The mobile terminal 100 may further include at least one sensor 150, such as an optical sensor, a motion sensor, and other sensors. Specifically, the optical sensor may include an ambient light sensor and a proximity sensor. The ambient light sensor may adjust luminance of the display panel 141 according to brightness of the ambient light. The proximity sensor may switch off the display panel 141 and/or backlight when the mobile terminal 100 is moved to the ear. As one type of motion sensor, a gravity acceleration sensor may detect magnitude of accelerations at various directions (which generally are triaxial), may detect magnitude and a direction of the gravity when static, and may be configured to identify an application of a mobile phone attitude (such as switching between horizontal and vertical screens, a related game, and attitude calibration of a magnetometer), a related function of vibration identification (such as a pedometer and a knock). Other sensors, such as a gyroscope, a barometer, a hygrometer, a thermometer, and an infrared sensor, which may be configured in the mobile terminal 100 are not further described herein.

The audio circuit 160, a loudspeaker 161, and a microphone 162 may provide audio interfaces between the user and the mobile terminal 100. The audio circuit 160 may transmit, to the loudspeaker 161, a received electric signal converted from received audio data. The loudspeaker 161 converts the electric signal into a sound signal for output. On the other hand, the microphone 162 converts a collected sound signal into an electric signal. The audio circuit 160 receives the electric signal and converts the electric signal into audio data, and outputs the audio data to the processor 180 for processing. Then, the processor 180 sends the audio data to, for example, another terminal by using the RF circuit 110, or outputs the audio data to the memory 120 for further processing. The audio circuit 160 may further include an earplug jack, so as to provide communication between a peripheral earphone and the mobile terminal 100.

The mobile terminal 100 may help, by using the transmission module 170 (e.g. Wi-Fi module), a user to receive and send an e-mail, browse a webpage, and access stream media, and the like, which provides wireless broadband Internet access for the user. Although FIG. 3 shows the transmission module 170, it may be understood that, the wireless communications unit is not a necessary component of the mobile terminal 100, and can be ignored according to demands without changing the scope of the essence of the present disclosure.

The processor 180 is a control center of the mobile terminal 100, and connects various parts of the terminal by using various interfaces and lines. By running or executing the software program and/or module stored in the memory 120, and invoking data stored in the memory 120, the processor 180 performs various functions and data processing of the mobile terminal 100, thereby performing overall monitoring on the mobile phone. Optionally, the processor 180 may include one or more processing cores. Preferably, the processor 180 may integrate an application processor and a modem. The application processor mainly processes an operating system, a user interface, an application program, and the like. The modem mainly processes wireless communication. It may be understood that, the foregoing modem may not be integrated into the processor 180.

The mobile terminal 100 further includes the power supply 190 (such as a battery) for supplying power to the components. Preferably, the power supply may be logically connected to the processor 180 by using a power supply management system, thereby implementing functions, such as charging, discharging, and power consumption management, by using the power supply management system. The power supply 190 may further include any component, such as one or more direct current or alternate current power supplies, a re-charging system, a power supply fault detection circuit, a power supply converter or an inverter, and a power supply state indicator.

Although not shown in the figure, the mobile terminal 100 may further include a camera (a front camera or a rear camera), a Bluetooth module, and the like, which are not further described herein. Specifically, in this embodiment, the display unit of the mobile terminal 100 is a touch screen display.

Above are embodiments of the present invention, which does not limit the scope of the present invention. Any modifications, equivalent replacements or improvements within the spirit and principles of the embodiment described above should be covered by the protected scope of the invention.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A pixel driving circuit used in a display panel having a scan line and a data line, the pixel driving circuit comprising:

a switch thin film transistor, configured to receive data signal applied on the data line in response to scan signal applied on the scan line;

a storage capacitor, electrically connected to the switch thin film transistor and configured to be charged by the data signal; and a light driving circuit, configured to emit light in response to the data signal, the light driving circuit having a driving unit, light-emitting unit, a supply voltage end, a ground end, and a voltage-dividing transistor that is coupled between the driving unit and the ground end, wherein the driving unit consisting of a Metal Oxide Semiconductor Field Effect Transistor (MOSFET), the voltage-dividing transistor is configured to reduce a variation in a magnitude of a source-drain current of the MOSFET due to changes in the data signal, wherein one end of the storage capacitor is electrically connected to a gate of the MOSFET and a source of the switch thin film transistor, and another end of the storage capacitor is directly electrically connected to the ground end, wherein connection of the driving unit and the voltage-dividing transistor results in adjustment of a source-drain voltage of the voltage-dividing transistor to cause the voltage-dividing transistor to operate in a linear region or a saturation region.

2. The pixel driving circuit as claimed in claim 1, wherein a resistance of the voltage-dividing transistor is proportional to levels of grayscales of the display panel.

3. The pixel driving circuit as claimed in claim 2, wherein the voltage-dividing transistor is a voltage-dividing thin film transistor having a gate and a drain coupled thereto, and a ratio of a channel width and a channel length is proportional to levels of grayscales of the display panel.

4. The pixel driving circuit as claimed in claim 3, wherein the switch thin film transistor and the voltage-dividing thin film transistor are Amorphous silicon thin film transistors or indium gallium zinc oxide thin film transistors.

5. The pixel driving circuit as claimed in claim 1, wherein the voltage-dividing transistor is realized by transistors connected in series or in parallel.

6. The pixel driving circuit as claimed in claim 1, wherein the MOSFET comprises a gate coupled to the switch thin film transistor, a drain coupled to the supply voltage end, and a source coupled to the ground end.

7. The pixel driving circuit as claimed in claim 1, wherein the light-emitting unit is coupled between the supply voltage end and the driving unit or between the driving unit and the ground end.

8. The pixel driving circuit as claimed in claim 1, wherein a ratio of a supply voltage fed to the pixel driving circuit and a sum of a first resistance of the voltage-dividing transistor and a second resistance of the light-emitting unit is between values of a minimum driving current and a maximum driving current of the light-emitting unit.

9. The pixel driving circuit as claimed in claim 1, wherein the voltage-dividing transistor is a light emitting diode.

10. A mobile terminal comprising:

a display panel, having a scan line and a data line;

a gate driver, connected to the scan line;

a source driver, connected to the data line;

a pixel driving circuit, configured to drive the display panel, the pixel driving circuit comprising:

a switch thin film transistor, configured to receive data signal applied on the data line in response to scan signal applied on the scan line;

a storage capacitor, electrically connected to the switch thin film transistor and configured to be charged by the data signal; and a light driving circuit, configured to emit light in response to the data signal, the light driving circuit having a driving unit, light-emitting unit, a supply voltage end, a ground end, and a voltage-dividing transistor that is coupled between the driving unit and the ground end, wherein the driving unit consisting of a Metal Oxide Semiconductor Field Effect Transistor (MOSFET), the voltage-dividing transistor is configured to reduce a variation in a magnitude of a source-drain current of the MOSFET due to changes in the data signal wherein one end of the storage capacitor is electrically connected to a gate of the MOSFET and a source of the switch thin film transistor, and another end of the storage capacitor is directly electrically connected to the ground end, wherein connection of the driving unit and the voltage-dividing transistor results in adjustment of a source-drain voltage of the voltage-dividing transistor to cause the voltage-dividing transistor operate in a linear region or a saturation region.

11. The mobile terminal as claimed in claim 10, wherein a resistance of the voltage-dividing transistor is proportional to levels of grayscales of the display panel.

12. The pixel driving circuit as claimed in claim 11, wherein the voltage-dividing transistor is a voltage-dividing thin film transistor having a gate and a drain coupled thereto, and a ratio of a channel width and a channel length is proportional to levels of grayscales of the display panel.

13. The pixel driving circuit as claimed in claim 12, wherein the switch thin film transistor and the voltage-dividing thin film transistor are Amorphous silicon thin film transistors or indium gallium zinc oxide thin film transistors.

14. The pixel driving circuit as claimed in claim 10, wherein the MOSFET comprises a gate coupled to the switch thin film transistor, a drain coupled to the supply voltage end, and a source coupled to the ground end.

15. The pixel driving circuit as claimed in claim 10, wherein the light-emitting unit is coupled between the supply voltage end and the driving unit or between the driving unit and the ground end.

16. The pixel driving circuit as claimed in claim 10, wherein a ratio of a supply voltage fed to the pixel driving circuit and a sum of a first resistance of the voltage-dividing transistor and a second resistance of the light-emitting unit is between values of a minimum driving current and a maximum driving current of the light-emitting unit.

* * * * *